Sept. 8, 1970 R. K. JEFFERS 3,528,023
AMPLIFIER
Filed Aug. 29, 1968

INVENTOR.
ROBERT K. JEFFERS

BY M. LuKacher
ATTY

United States Patent Office 3,528,023
Patented Sept. 8, 1970

3,528,023

AMPLIFIER

Robert K. Jeffers, Penfield, N.Y., assignor to General Dynamics Corporation, a corporation of Delaware Filed Aug. 29, 1968, Ser. No. 756,261
Int. Cl. H03f *3/16*
U.S. Cl. 330—35 7 Claims

ABSTRACT OF THE DISCLOSURE

An RF amplifier is described using a field effect transistor. The output circuit is connected to the source electrode of the field effect transistor while input signals are applied to the gate thereof, so as to constitute a field effect source follower. A toroidal ferrite step-down transformer is connected to the source electrode so as to reflect a low impedance presented by a series tuned circuit connected to its step-down side into the source circuit whereby to provide a large amount of degeneration, except at the frequency to which the amplifier is tuned, thereby reducing cross modulation distortion.

The present invention relates to amplifier circuits, and particularly to radio frequency amplifiers using field effect transistors.

The invention is especially suitable for use as a radio frequency amplifier in high frequency communication receivers. The invention, however, will find general application in other equipment where low distortion is desired.

While it is desirable to use solid state devices in low signal amplifier stages, such as RF amplifier stages, the non-linearities inherent in such devices have presented serious problems due to cross modulation distortion, particularly where large amplitude signals, which are adjacent in frequency to the frequency to which the amplifier is tuned, are present. The need for handling large signals may be solved by providing lossy circuits. However, such circuits degrade the frequency selectivity which is desired in radio frequency amplifiers. It is, of course, desirable to provide power gain in the amplifier which can be converted to a voltage gain at the output of the amplifier. The need for lossy circuits would degrade such power gain of the amplifier. Thus, multiple stages of amplification may be required in order to satisfy the needs of a radio or other equipment in which RF gain is required.

Accordingly, it is an object of the present invention to provide an improved solid state radio frequency amplifier.

It is a still further object of the present invention to provide an improved amplifier utilizing field effect transistors which is linear in operation and does not suffer from cross-modulation distortion.

It is a still further object of the present invention to provide an improved solid state radio frequency amplifier utilizing field effect transistors which has a large power gain and selectivity.

Briefly described, an amplifier embodying the invention includes a field effect transistor having gate, drain and source electrodes. An input circuit, which may be a tuned circuit, is connected to the gate electrode of the field effect transistor. An output circuit is connected to one of the drain and source elecrodes, while the other is connected to a source of operating potential, as well as to alternating current ground. The output circuit includes a resonant circuit which is coupled via a transformer to present a relatively low impedance at the resonant frequency of the series tuned circuit and a relatively high impedance at frequencies off the resonant frequency. The winding of the transformer which is connected to the field effect transistor presents a large load impedance which causes degeneration in the circuit and linear operation with respect to large interfering signals; thus, making the circuit linear with respect to such signals and precluding cross-modulation distortion.

In addition, the tuned circuits themselves may have, by virtue of the transformation ratio of the transformer, a relatively high Q, thus, providing a high degree of selectivity in the amplifier. Power gain in the amplifier also is high. The output from the amplifier may be taken across one of the reactive elements in the resonant circuit, say the capacitor, so as to provide a large output voltage. Accordingly, the amplifier may be operated to provide good voltage gain.

The invention itself, both as to its organization and method of operation, as well as additional objects and advantages thereof will become more readily apparent from a reading of the following description in connection with the accompanying drawings in which.

Figure 1:
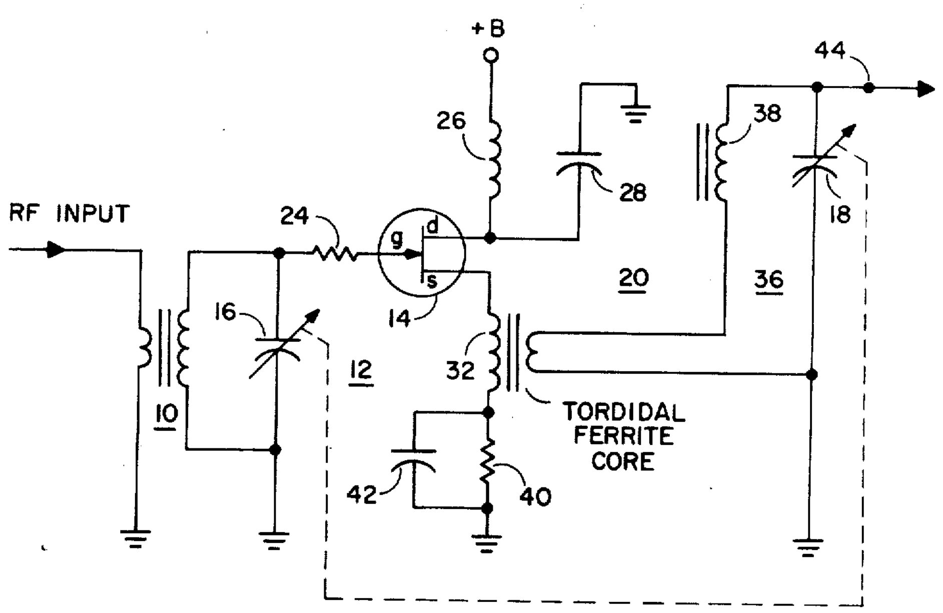
FIG. 1 is a circuit diagram of a field effect transistor amplifier embodying the invention.

Referring more particularly to FIG. 1, a radio frequency signal, as may be derived from an antenna, is applied to the input winding of a transformer 10 which is part of the input circuit 12 of the amplifier. The transformer 10 may be an air core or ferrite core transformer having a suitable ratio so as to match the antenna impedance to the input impedance of the field effect transistor 14 which is used in the amplifier. While an N channel type field effect transistor is shown, P channel type transistor may be used by changing the polarity of the operating voltage. The secondary of the transformer 10 in the input circuit is tuned by a capacitor 16. This capacitor may be a variable capacitor and is ganged with a capacitor 18 in the output circuit 20 of the amplifier. The junction of the secondary of the transformer 10 and the tuning capacitor 16 is connected by way of a resistor 24 to the gate electrode of the field effect transistor 14. This resistor 24 is selected so as to have a value which exceeds the value of negative impedance which may appear at the input of the amplifier under certain conditions of mistuning. As long as the value of the resistor exceeds the maximum value of negative impedance instability in the amplifier is precluded.

A source of operating voltage indicated as B+ is connected to the drain electrode of the transistor 14 by way of a radio frequency choke 26. The drain electrode is grounded for alternating currents by way of a by-pass capacitor 28.

The output circuit of the amplifier is connected to the source electrode of the transistor 14, so that the amplifier overall is connected as a common drain, source follower amplifier. The output circuit itself includes a toroidal ferrite core transformer 30 having a primary winding 32 and a secondary winding 34. The windings of the transformer may be wound on the toroidal ferrite core which is selected to have good magnetic properties over the frequency range of the amplifier. In the event that the amplifier operates over the high frequency band, a very small core, say one quarter inch in diameter, may be used. The primary winding and the secondary winding may be bifilar wound on the core. The transformation ratio is selected so that the source impedance of the transistor is matched to the impedance of a resonant circuit 36 which is connected across the secondary winding 34. For example, the primary winding 32 may have about 14 turns, while the secondary winding is only a single turn.

The resonant circuit 36 includes an inductor 38 and the variable capacitor 18. The inductor 38 may have a ferrite core and may be of a variable permeability type (viz, the core of the transformer may have a variable gap which may be adjusted to adjust the inductance). The primary winding 32 is also connected to ground by way of a biasing circuit, including the resistor 40 and a bypass capacitor 42. The output signal from the output circuit 20 may be derived at a terminal 44 which is connected to the junction of the inductor 38 and the capacitor 18. The output voltage therefore is that which appears across the capacitor 18.

Figure 2:
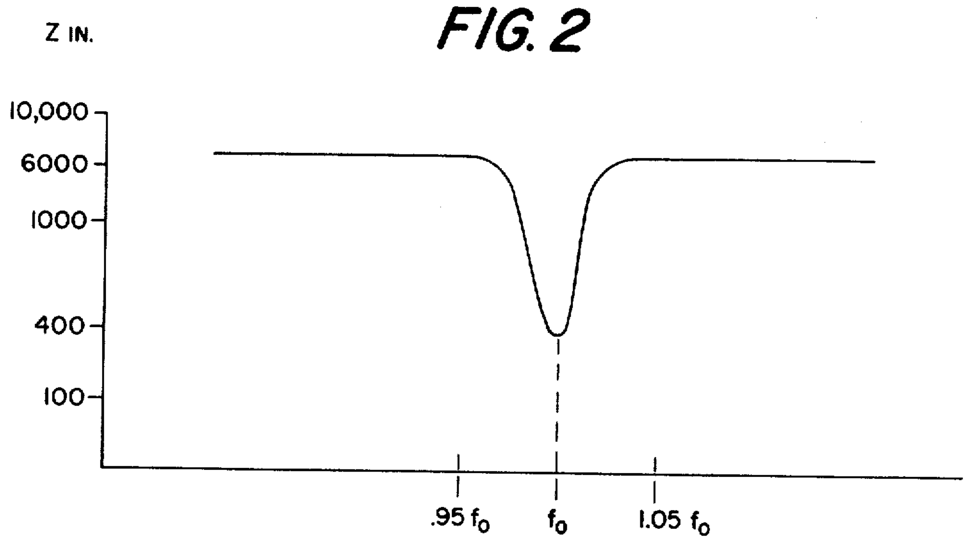
FIG. 2 is a curve of the impedance presented across the primary winding of the output circuit transformer used in the circuit of FIG. 1.

The impedance presented across the primary 32 of the transformer 20 is depicted by the curve in FIG. 2. It will be observed that at resonance, this impedance drops to a value which matches the source impedance of the field effect transistor 14. At resonance, this impedance is entirely resistive. Off resonance, the impedance increases markedly from a value, say of about 400 ohms to somewhat over 6,000 ohms. Accordingly, the degenerative load impedance in the source follower circuit is increased for signals which are off the resonant frequency (i.e., the frequency to which the amplifier is tuned). This large amount of degeneration enhances the linearity of the amplifier with respect to large amplitude interfering signals, thereby precluding the generation of cross-modulation distortion components. The Q of the inductors in the circuits, particularly the inductor 38, may be very high, since the necessary impedance transformation is provided by the transformer 30. Accordingly, the sensitivity of the amplifier is enhanced. The circuit operating as a source follower has high power gain. This power gain may be converted into a voltage gain by taking the output voltage at the terminal 44.

From the foregoing description, it will be apparent that there has been provided an improved solid state amplifier having low cross-modulation distortion, high selectivity and good gain. Of course, variations and modifications of the herein described circuit, which has been simplified in order to clarify the exposition of the invention, will undoubtedly suggest themselves to those skilled in the art. Accordingly, the foregoing description should be taken merely as illustrative and not in any limited sense.

What is claimed is:

1. An amplifier comprising a field effect transistor having gate, drain and source electrodes, an input circuit for applying signals to said gate electrode, an output circuit for deriving output signals from one of said source and drain electrodes, said output circuit including a resonant circuit across which said output signals are derived, and a transformer coupling said resonant circuit to said one electrode so as to provide a relatively low impedance at said one electrode at the resonant frequency thereof and a relatively high impedance at other frequencies above and below said resonant frequency.

2. The invention as set forth in claim 1 wherein said output circuit is connected to said source electrode so as to provide a source follower configuration for said amplifier.

3. The invention as set forth in claim 1 wherein said transformer has a secondary winding of relatively few turns and a primary winding of relatively many turns connected to said one electrode, said resonant circuit including an inductor and a capacitor connected in series across said secondary winding, and means for deriving said output signals at the junction of said inductor and capacitor.

4. The invention as set forth in claim 3 wherein said transformer has a toroidal core of ferrite material.

5. The invention as set forth in claim 3 wherein said one electrode is said source electrode.

6. The invention as set forth in claim 5 wherein said input circuit includes a tuned circuit connected between said gate electrode and via said primary winding to said source electrode, said input circuit tuned circuit having a capacitor, and said output circuit resonant circuit capacitor being variable to tune said input and output circuits to like frequencies.

7. The invention as set forth in claim 3 including a resistor connected in said input circuit; said resistor having a value greater than the value of negative impedance presented by said output circuit for conditions of mistuning of said input and output circuits.

No references cited.

JOHN KOMINSKI, Primary Examiner

U.S. Cl. X.R.

330—31, 38, 168